(12) United States Patent
Hsin

(10) Patent No.: US 11,309,275 B2
(45) Date of Patent: Apr. 19, 2022

(54) SENSOR PACKAGE STRUCTURE

(71) Applicant: KINGPAK TECHNOLOGY INC., Hsin-Chu County (TW)

(72) Inventor: Chung-Hsien Hsin, Hsin-Chu County (TW)

(73) Assignee: KINGPAK TECHNOLOGY INC., Hsin-Chu County (TW)

( * ) Notice: Subject to any disclaimer, the term of this patent is extended or adjusted under 35 U.S.C. 154(b) by 0 days.

(21) Appl. No.: 17/038,011

(22) Filed: Sep. 30, 2020

(65) Prior Publication Data
US 2021/0398934 A1 Dec. 23, 2021

(30) Foreign Application Priority Data
Jun. 18, 2020 (TW) ............................... 109120611

(51) Int. Cl.
*H01L 23/00* (2006.01)
*H01L 27/146* (2006.01)
*H01L 23/498* (2006.01)

(52) U.S. Cl.
CPC .............. *H01L 24/48* (2013.01); *H01L 24/49* (2013.01); *H01L 23/49816* (2013.01); *H01L 27/14618* (2013.01); *H01L 2224/48091* (2013.01); *H01L 2224/48101* (2013.01); *H01L 2224/48229* (2013.01); *H01L 2224/49176* (2013.01); *H01L 2924/182* (2013.01); *H01L 2924/1815* (2013.01)

(58) Field of Classification Search
CPC ... H01L 24/48; H01L 24/49; H01L 23/49816; H01L 2224/48091; H01L 2224/48101; H01L 2224/48229; H01L 2224/49176; H01L 2924/1815; H01L 2924/182
See application file for complete search history.

(56) References Cited

U.S. PATENT DOCUMENTS

| 2008/0191335 A1* | 8/2008 | Yang | H01L 27/14683 257/E23.18 |
| 2018/0019274 A1* | 1/2018 | Yang | H01L 27/14618 |
| 2019/0057992 A1* | 2/2019 | Chen | H01L 27/14636 |
| 2019/0135614 A1* | 5/2019 | Kierse | G01N 33/0009 |

* cited by examiner

*Primary Examiner* — Marc Anthony Armand
(74) *Attorney, Agent, or Firm* — Li & Cai Intellectual Property (USA) Office

(57) ABSTRACT

A sensor package structure is provided and includes a substrate, a sensor chip disposed on the substrate, a padding layer disposed on the substrate, a plurality of wires, a support, and a light-permeable layer disposed on the support. A top side of the padding layer is coplanar with a top surface of the sensor chip, the support is disposed on the top side of the padding layer and the top surface of the sensor chip, and the wires are embedded in the support. Terminals at one end of the wires are connected to the top surface of the sensor chip, and terminals at the other end of the wires are connected to the top side of the padding layer, so that the sensor chip can be electrically coupled to the substrate through the wires and the padding layer.

8 Claims, 7 Drawing Sheets

SENSOR PACKAGE STRUCTURE

CROSS-REFERENCE TO RELATED PATENT APPLICATION

This application claims the benefit of priority to Taiwan Patent Application No. 109120611, filed on Jun. 18, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure, and more particularly to a sensor package structure.

BACKGROUND OF THE DISCLOSURE

A conventional package structure includes a substrate, a sensor chip disposed on the substrate, and a plurality of wires connected to the substrate and the sensor chip. However, a height difference existing between the substrate and sensor chip makes a wire-break issue easily occur on any one of the wires. Moreover, when the thickness of the sensor chip increases, the height difference also increases, and the wires would have longer arc lengths, which more easily results in wire-break issues of the wires.

SUMMARY OF THE DISCLOSURE

In response to the above-referenced technical inadequacies, the present disclosure provides a sensor package structure to effectively improve on the issues associated with conventional sensor package structures.

In one aspect, the present disclosure provides a sensor package structure, which includes a substrate, a sensor chip, a padding layer, a plurality of wires, a support, and a light-permeable layer. The substrate has a first board surface and a second board surface that is opposite to the first board surface. The sensor chip is mounted on the first board surface of the substrate, and a top surface of the sensor chip has a sensing region and a plurality of metal pads arranged outside of the sensing region. The padding layer is disposed on the first board surface and is arranged adjacent to the metal pads. The padding layer includes a plurality of bonding regions arranged on a top side thereof and electrically coupled to the substrate. The top side of the padding layer is coplanar with the top surface of the sensor chip, and the bonding regions respectively correspond in position to the metal pads. Terminals at one end of the wires are respectively connected to the metal pads; terminals at the other end of the wires are respectively connected to the bonding regions, so that the sensor chip and the substrate are electrically coupled to each other through the wires and the padding layer. The support is disposed on the top side of the padding layer and the top surface of the sensor chip, and the wires are entirely embedded in the support. The light-permeable layer is disposed on the support and faces the sensing region of the sensor chip.

In summary, the sensor package structure in the present disclosure is provided with the padding layer which includes the bonding regions electrically coupled to the substrate, so that the sensor chip can be electrically coupled to the substrate through the padding layer and the wires. Hence, influence on the wires, resulted from the height difference between the substrate and the sensor chip, can be reduced.

Specifically, through disposing the padding layer and the sensor chip, both of which have the same height, in the disclosed sensor package structure, each of the wires electrically coupled to the padding layer and the sensor chip can be maintained to at a specific length that is not affected by the thickness of the sensor chip, thereby reducing the probability of wire-breaking.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

First Embodiment

Figure 1:
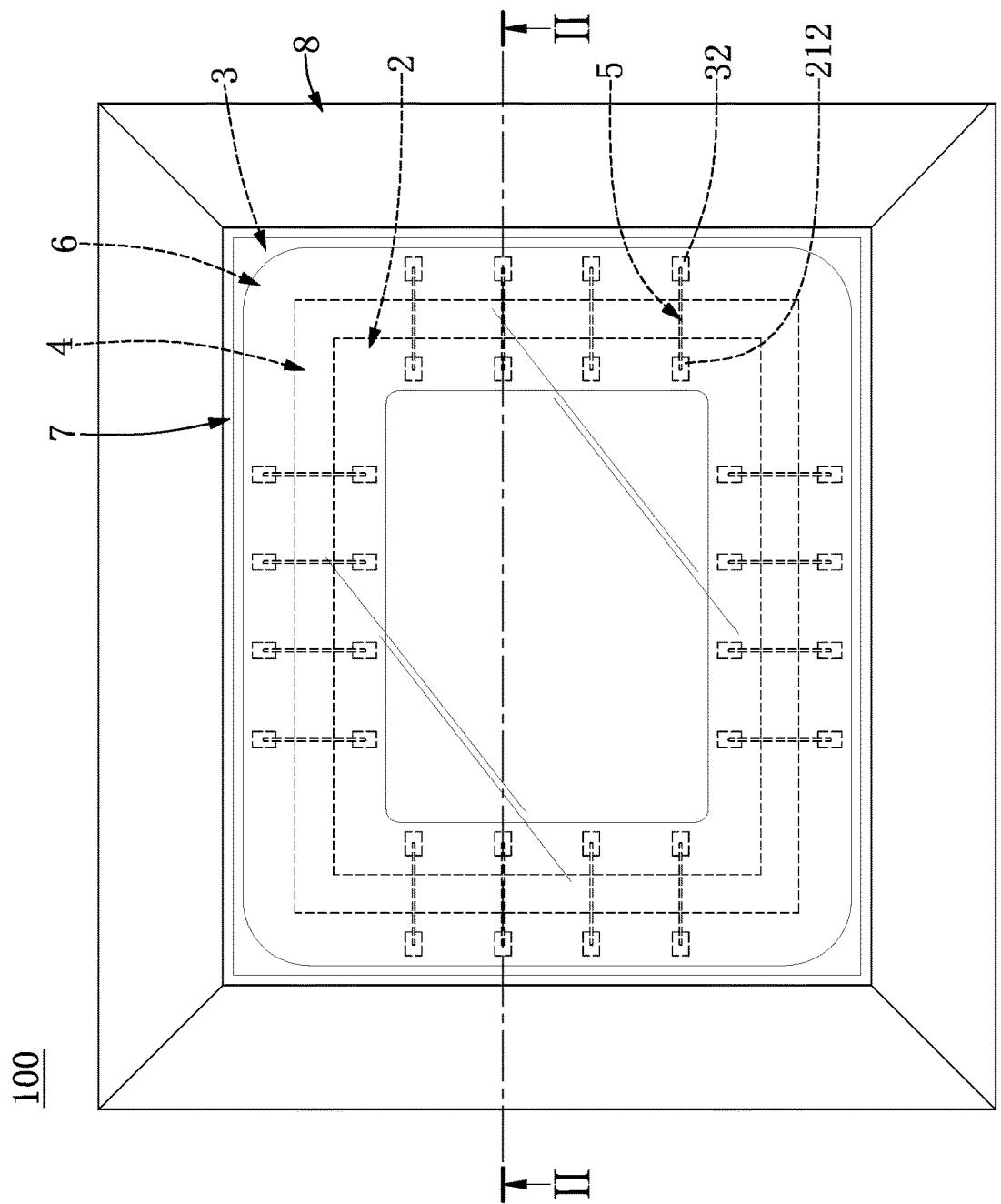
FIG. 1 is a top view of a sensor package structure according to a first embodiment of the present disclosure.
Figure 2:
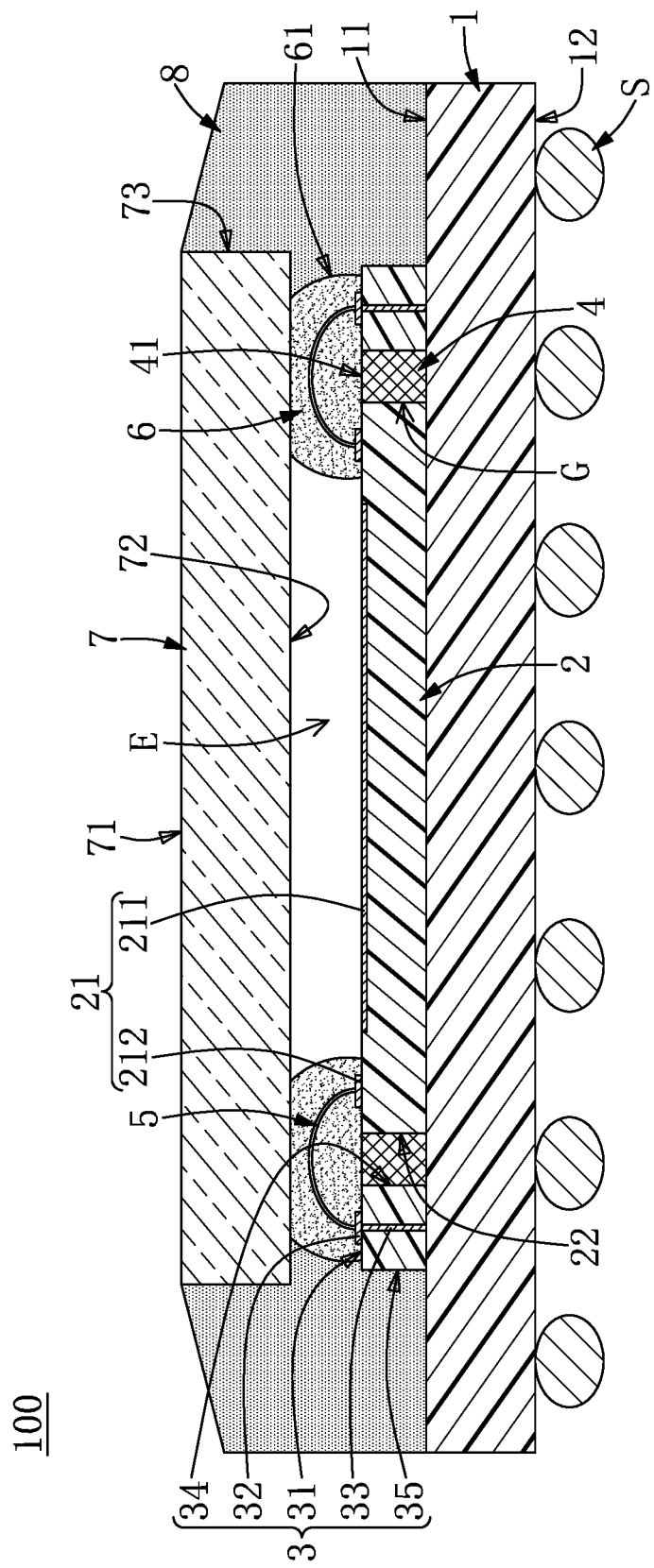
FIG. 2 is a cross-sectional view taken along line II-II of FIG. 1.

Referring to FIG. 1 and FIG. 2, a first embodiment of the present disclosure provides a sensor package structure 100, which includes a substrate 1, a sensor chip 2 mounted on the substrate 1, a padding layer 3 disposed on the substrate 1 and spaced apart from the sensor chip 2, a filler 4 located between the sensor chip 2 and the padding layer 3, a plurality of wires 5 connected to the sensor chip 2 and the padding layer 3, a support 6 disposed on the sensor chip 2 and the padding layer 3, a light-permeable layer 7 disposed on the support 6, and a package body 8 that is formed on the substrate 1 and that surrounds the above components.

The sensor package structure 100 in the present embodiment is described along with the above components, but the sensor package structure 100 can be modified according to design requirements. For example, in other embodiments not shown in the present disclosure, the sensor package structure 100 can be provided without the filler 4 and/or the package body 8.

The substrate 1 in the present embodiment is in a square shape or a rectangular shape, and has a first board surface 11 and a second board surface 12 that is opposite to the first board surface 11. The substrate 1 in the present embodiment can be provided with a plurality of solder balls S (e.g., tin solder ball) disposed on the second board surface 12. The sensor package structure 100 can be soldered onto or fixed onto an electronic component (not shown in the drawings) through the solder balls S, thereby electrically connecting the sensor package structure 100 and the electronic component.

Though the sensor chip 2 in the present embodiment is illustrated as an image sensor chip, the present disclosure is not limited thereto. The sensor chip 2 is mounted on a substantial center portion of the first board surface 11 of the substrate 1. Moreover, a top surface 21 of the sensor chip 2 has a sensing region 211 and a plurality of metal pads 212 arranged outside of the sensing region 211. The metal pads 212 in the present embodiment surround the sensing region 211 in a substantial ring-shape arrangement.

The padding layer 3 is disposed on the first board surface 11 of the substrate 1 and is arranged adjacent to the metal pads 212. In the present embodiment, the padding layer 3 is in a ring shape and surrounds an outer lateral side 22 of the sensor chip 2, and a ring-shaped gap G is formed between the padding layer 3 and (the outer lateral side 22 of) the sensor chip 2. Moreover, the padding layer 3 is preferably spaced apart from the sensor chip 2 at a constant distance for facilitating formation of the wires 5.

Moreover, the material (or the insulating material) of the padding layer 3 is preferably different from that of the substrate 1, but the present disclosure is not limited thereto. For example, in other embodiments not shown in the present disclosure, the material (or the insulating material) of the padding layer 3 can be identical to that of the substrate 1.

Specifically, a top side 31 of the padding layer 3 is coplanar with the top surface 21 of the sensor chip 2. The padding layer 3 includes a plurality of bonding regions 32 arranged on the top side 31 thereof, the bonding regions 32 are electrically connected to the substrate 1, and the bonding regions 32 respectively correspond in position to the metal pads 212. In other words, each of the bonding regions 32 and the corresponding metal pad 212 are arranged adjacent to each other, and both have the same height with respect to the first board surface 11. In addition, the quantity of the bonding regions 32 of the padding layer 3 corresponds to (or is equal to) that of the metal pads 212 of the sensor chip 2.

Moreover, the padding layer 3 includes a plurality of conducting paths 33 respectively connected to the bonding regions 32, and the conducting paths 33 are connected to the substrate 1. The conducting paths 33 can be formed on an outer surface of the padding layer 3 or can be embedded in the padding layer 3, but the present disclosure is not limited thereto.

The filler 4 is formed in the ring-shaped gap G (i.e., the filler 4 is formed on the first board surface 11 of the substrate 1, and is connected to an inner lateral side 34 of the padding layer 3 and the outer lateral side 22 of the sensor chip 2). A top side 41 of the filler 4 is coplanar with the top side 31 of the padding layer 3 and the top surface 21 of the sensor chip 2, but the present disclosure is not limited thereto. For example, in other embodiments not shown in the present disclosure, the filler 4 can be connected to a peripheral edge of the top surface 21 of the sensor chip 2 and the top side 31 of the padding layer 3, but the top side 41 of the filler 4 is substantially concave or convex relative to the top surface 21 of the sensor chip 2.

The wires 5 are respectively connected to the metal pads 212 through terminals at one end of the wires, and are respectively connected to the bonding regions 32 through terminals at the other end of the wires (e.g., each of the wires 5 crosses the ring-shaped gap G or the filler 4 to connect the corresponding metal pad 212 and the corresponding bonding region 32), so that the sensor chip 2 and the substrate 1 can be electrically coupled to each other through the wires 5 and the padding layer 3.

Accordingly, the sensor package structure 100 in the present embodiment is provided with the padding layer 3 which includes the bonding regions 32 electrically coupled to the substrate 1, so that the sensor chip 2 can be electrically coupled to the substrate 1 through the padding layer 3 and the wires 5. Hence, influence on the wires 5, resulted from the height difference between the substrate 1 and the sensor chip 1, can be reduced.

Specifically, through disposing the padding layer 3 and the sensor chip 1, both of which have the same height, in the sensor package structure 100, each of the wires 5 electrically coupled to the padding layer 3 and the sensor chip 2 can be maintained to at a specific length that is not affected by the thickness of the sensor chip 2, thereby reducing the wire-break probability.

The support 6 is disposed on (or connected to) the top side 31 of the padding layer 3, the top surface 21 of the sensor chip 2, and the top side 41 of the filler 4. In the present embodiment, the support 6 is in a ring shape, the wires 5 are entirely embedded in the support 6, and the support 6 does not contact the sensing region 211 of the sensor chip 2 or an outer lateral side 35 of the padding layer 3, but the present disclosure is not limited thereto. For example, in other embodiments not shown in the present disclosure, the support 6 can further extend to cover the lateral side 35 of the padding layer 3.

The light-permeable layer 7 in the present embodiment is a transparent glass plate, but the present disclosure is not limited thereto. The light-permeable layer 7 is disposed on the support 6. In other words, the light-permeable layer 7 abuts against one side of the support 6. The top side 31 of the padding layer 3, the top side 41 of the filler 4, and the top surface 21 of the sensor chip 2 jointly abut against the other side of the support 6.

Specifically, the light-permeable layer 7 has a first surface 71, a second surface 72 opposite to the first surface 71, and an outer lateral side 73 that is connected to the first surface 71 and the second surface 72. The second surface 72 of the light-permeable layer 7 is disposed on the support 6. The top surface 21 of the sensor chip 2, the support 6, and the second surface 72 of the light-permeable layer 7 jointly define an enclosed space E, and the sensing region 211 is located in the enclosed space E and faces the light-permeable layer 7.

The package body 8 is formed on the first board surface 11 of the substrate 1. The package body 8 surrounds and is connected to the outer lateral side 35 of the padding layer 3, the outer lateral side 61 of the support 6, and the outer lateral side 73 of the light-permeable layer 7. The package body 8 in the present embodiment is a solidified liquid compound, but the present disclosure is not limited thereto. For example, in other embodiments not shown in the present disclosure, the package body 8 can be a molding compound; or, the package body 8 can include a solidified liquid compound and a molding compound that is formed on the solidified liquid compound.

Second Embodiment

Figure 3:
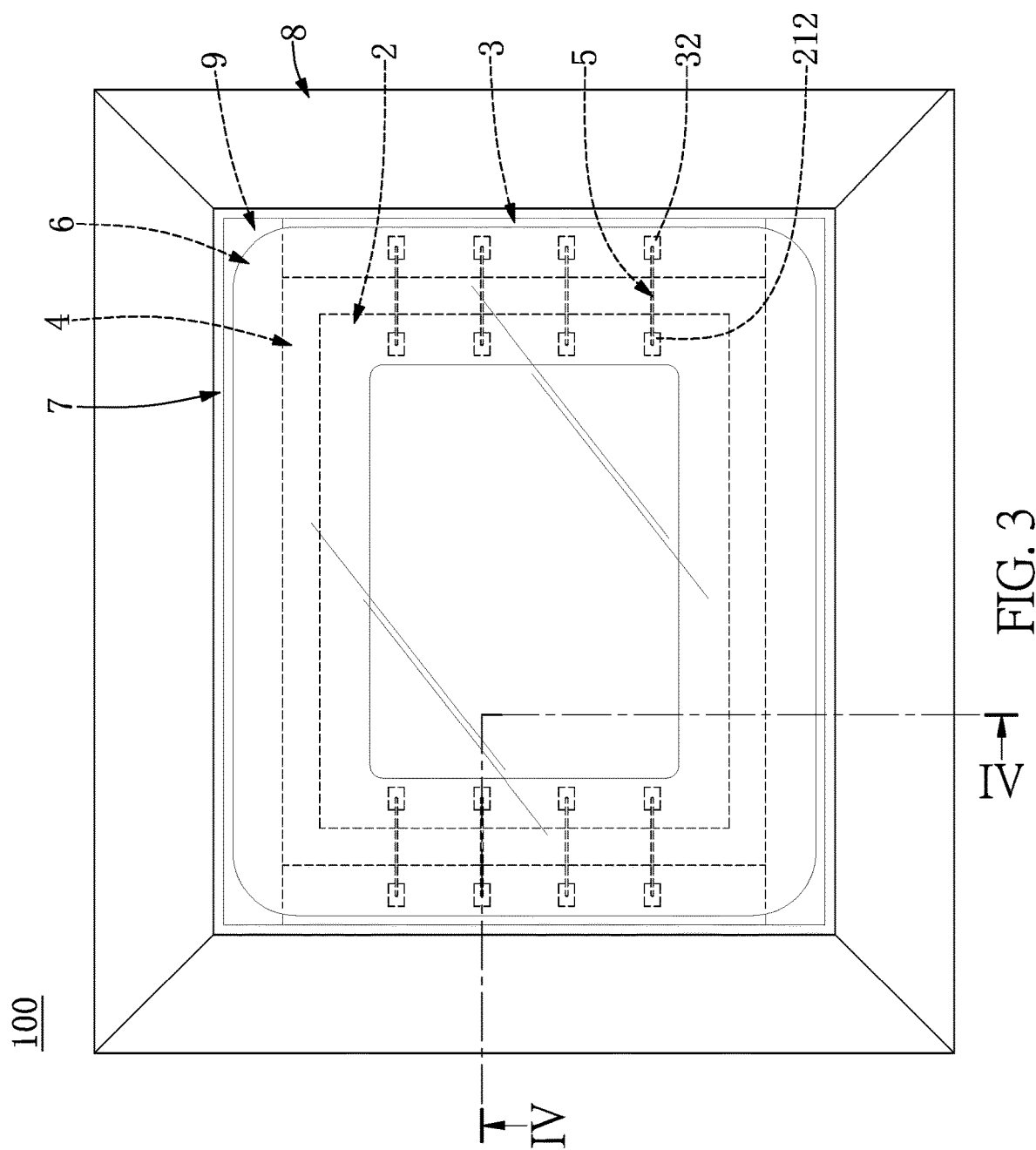
FIG. 3 is a top view of a sensor package structure according to a second embodiment of the present disclosure.
Figure 4:
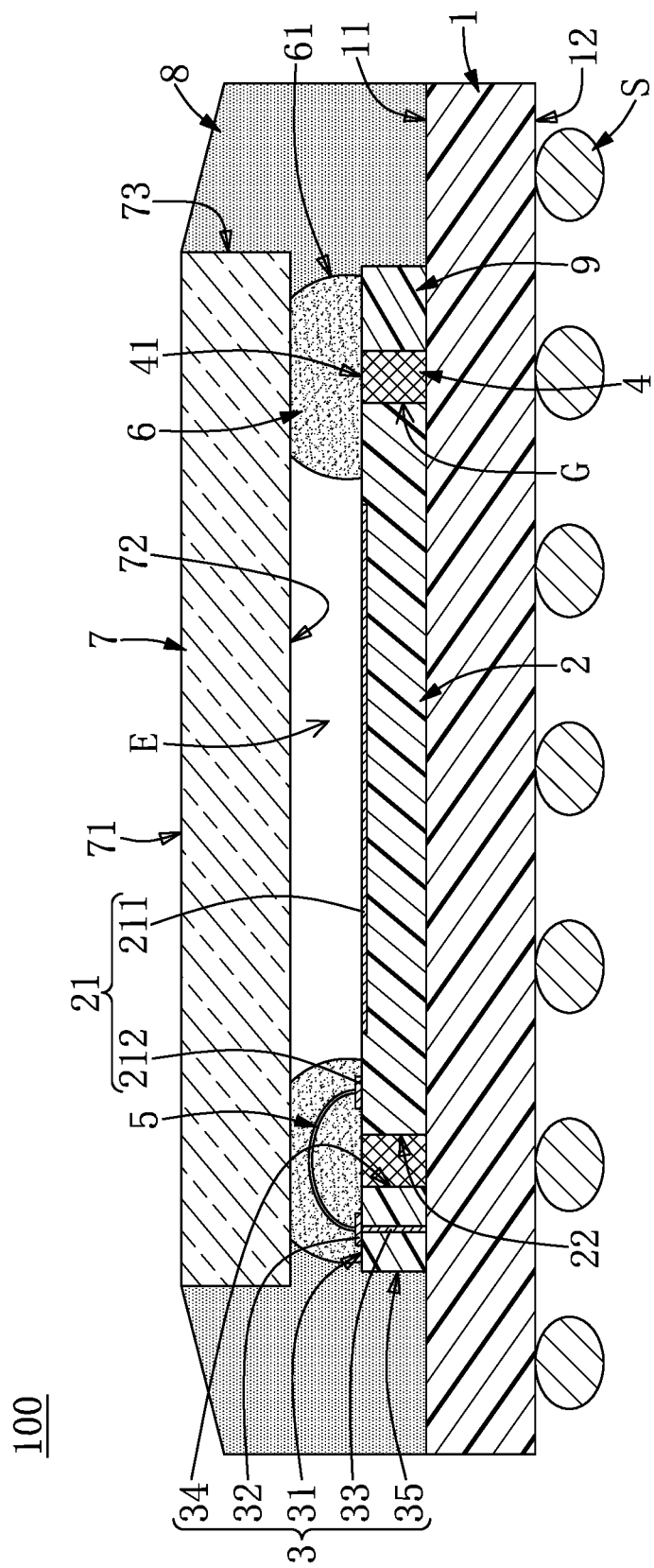
FIG. 4 is a cross-sectional view taken along line IV-IV of FIG. 3.

Referring to FIG. 3 and FIG. 4, a second embodiment of the present disclosure is illustrated. Since the second embodiment is similar to the above first embodiment, identical portions between the two embodiments will not be recited again, and the differences between the two embodiments shall be described in the following:

In the present embodiment, the padding layer 3 is not in a ring shape, and the sensor package structure 100 further includes a closing layer 9 disposed on the first board surface 11 of the substrate 1. The closing layer 9 is connected to the padding layer 3 so as to jointly form a ring-shaped structure surrounding the outer lateral side 22 of the sensor chip 2. Moreover, the closing layer 9 is not electrically connected to the substrate 1 and the sensor chip 2, and a top side of the closing layer 9 is coplanar with the top side 31 of the padding layer 3 and the top surface 21 of the sensor chip 2.

Specifically, the closing layer 9 can be spaced apart from (the outer lateral side 22 of) the sensor chip 2, so that a ring-shaped gap G is formed between the ring-shaped structure and the sensor chip 2. Moreover, the filler 4 is formed in the ring-shaped gap G, and the top side 41 of the filler 4 is coplanar with the top side 31 of the padding layer 3 and the top surface 21 of the sensor chip 2, but the present disclosure is not limited thereto.

The support 6 in the present embodiment is in a ring shape, and is formed on the top side 31 of the padding layer 3, the top side of the closing layer 9, the top surface 21 of the sensor chip 2, and the top side 41 of the filler 4. Moreover, the support 6 does not contact the sensing region 211 of the sensor chip 2, the outer lateral side 35 of the padding layer 3, or an outer lateral side of the closing layer 9, but the present disclosure is not limited thereto.

Third Embodiment

Figure 5:
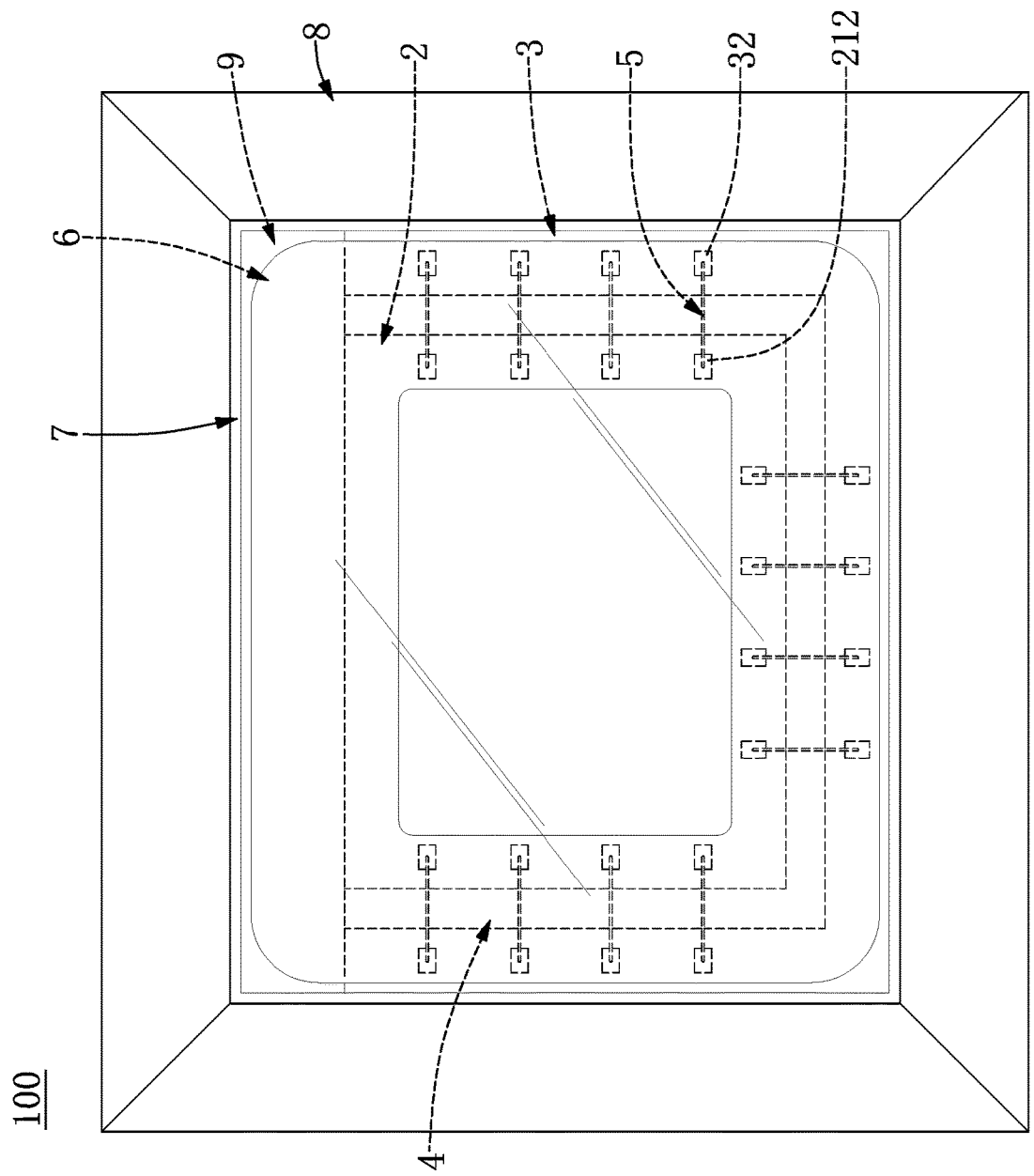
FIG. 5 is a top view of a sensor package structure according to a third embodiment of the present disclosure.
Figure 6:
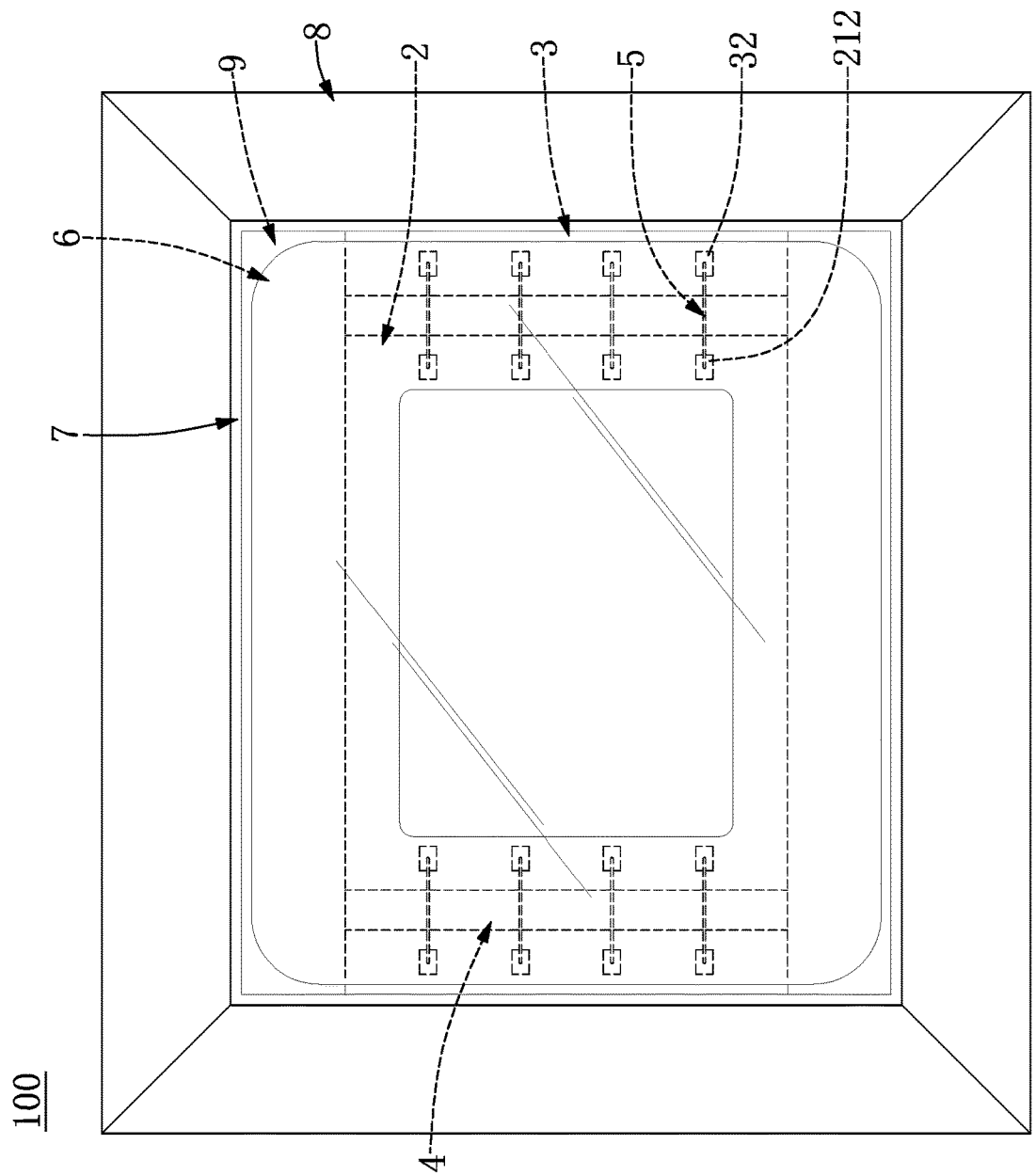
FIG. 6 is a top view of the sensor package structure in another configuration according to the third embodiment of the present disclosure.
Figure 7:
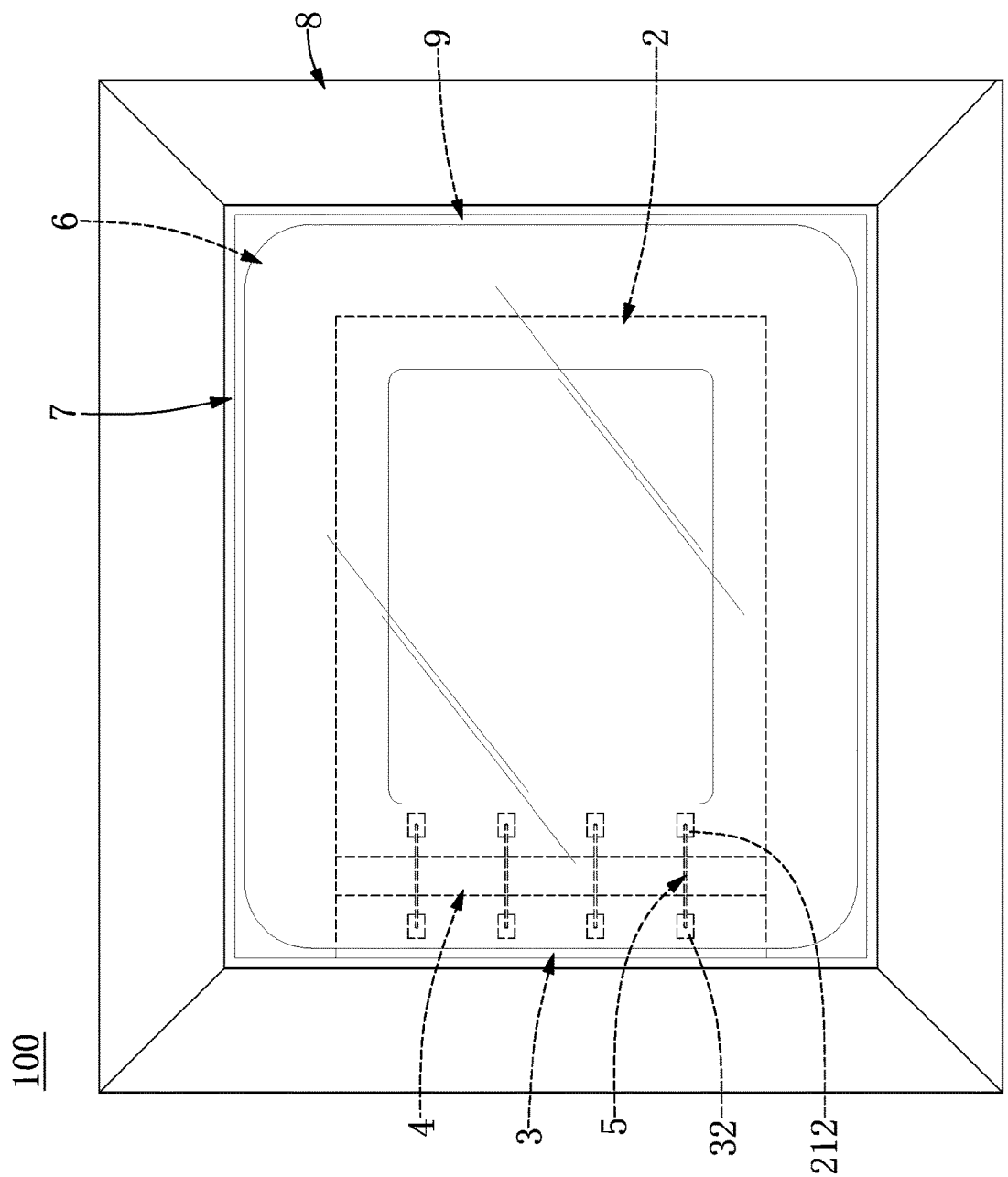
FIG. 7 is a top view of the sensor package structure in still another configuration according to the third embodiment of the present disclosure.

Referring to FIG. 5 to FIG. 7, a third embodiment of the present disclosure is disclosed. Since the third embodiment is similar to the second embodiment, identical portions between the third and second embodiments will be neglected, and the differences between them shall be described in the following:

In the present embodiment, the closing layer 9 can be connected to the outer lateral side 22 of the sensor chip 2, so that the filler 4 is only formed between the sensor chip 2 and the padding layer 3. The support 6 in the present embodiment is in a ring shape, and is formed on the top side 31 of the padding layer 3, the top side of the closing layer 9, the top surface 21 of the sensor chip 2, and the top side 41 of the filler 4. Moreover, the support 6 does not contact the sensing region 211 of the sensor chip 2, the outer lateral side 35 of the padding layer 3, or the outer lateral side of the closing layer 9, but the present disclosure is not limited thereto.

In conclusion, the sensor package structure in the present disclosure is provided with the padding layer which includes the bonding regions electrically coupled to the substrate, so that the sensor chip can be electrically coupled to the substrate through the padding layer and the wires, and influence on the wires, resulted from the height difference between the substrate and the sensor chip, can be reduced. Accordingly, once the sensor package structure of the present disclosure is under different temperatures, separation phenomena of the wires from the metal pads or bonding regions is avoided since excessive stresses caused by thermal expansion or contraction within the wires won't be generated. In addition, since the metal pads of the sensor chip and the bonding regions of the padding layer are substantially located at the same height, a wire-break issue due to a larger pulling force exerted on the wires in a wire bond process can be effectively avoided.

Specifically, through disposing the padding layer and the sensor chip, both of which have the same height, in the disclosed sensor package structure, each of the wires electrically coupled to the padding layer and the sensor chip can be maintained to at a specific length that is not affected by the thickness of the sensor chip, thereby reducing the wire-break probability.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A sensor package structure, comprising:
   a substrate having a first board surface and a second board surface that is opposite to the first board surface;
   a sensor chip mounted on the first board surface of the substrate, wherein a top surface of the sensor chip has a sensing region and a plurality of metal pads arranged outside of the sensing region;
   a padding layer disposed on the first board surface and arranged adjacent to the metal pads, wherein the padding layer includes a plurality of bonding regions arranged on a top side thereof and electrically coupled to the substrate, and wherein the top side of the padding layer is coplanar with the top surface of the sensor chip, and the bonding regions respectively correspond in position to the metal pads;
   a plurality of wires, wherein terminals at one end of the wires are respectively connected to the metal pads, terminals at the other end of the wires are respectively connected to the bonding regions, so that the sensor chip and the substrate are electrically coupled to each other through the wires and the padding layer;
   a support disposed on the top side of the padding layer and the top surface of the sensor chip, wherein the support is in a ring shape, and the wires are entirely embedded in the support;
   a light-permeable layer disposed on the support and facing the sensing region of the sensor chip, wherein the top surface of the sensor chip, the support, and the light-permeable layer jointly define an enclosed space, and the sensing region is located in the enclosed space; and
   a package body formed on the first board surface, wherein the package body surrounds and is connected to an outer lateral side of the padding layer, an outer lateral side of the support, and an outer lateral side of the light-permeable layer.

2. The sensor package structure according to claim 1, wherein the padding layer is in a ring shape and surrounds an outer side of the sensor chip, and a ring-shaped gap is formed between the padding layer and the sensor chip, and wherein each of the wires crosses the ring-shaped gap to connect the corresponding metal pad with the corresponding bonding region.

3. The sensor package structure according to claim 2, further comprising a filler formed in the ring-shaped gap, wherein a top side of the filler is connected to the support.

4. The sensor package structure according to claim 3, wherein the top side of the filler is coplanar with the top side of the padding layer and the top surface of the sensor chip.

5. The sensor package structure according to claim 2, wherein a material of the padding layer is different from that of the substrate.

6. The sensor package structure according to claim 1, wherein the padding layer includes a plurality of conducting paths respectively connected to the bonding regions, and the conducting paths are connected to the substrate.

7. The sensor package structure according to claim 1, further comprising a closing layer disposed on the first board surface, wherein the closing layer is connected to the padding layer so as to jointly form a ring-shaped structure surrounding an outer lateral side of the sensor chip, and wherein the closing layer is not electrically connected to the substrate or the sensor chip.

8. The sensor package structure according to claim 7, wherein a top side of the closing layer is coplanar with the top side of the padding layer and the top surface of the sensor chip, and the support is formed on the top side of the padding layer and the top side of the closing layer.

* * * * *